United States Patent
Hsu et al.

(10) Patent No.: US 10,381,278 B2
(45) Date of Patent: Aug. 13, 2019

(54) TESTING METHOD OF PACKAGING PROCESS AND PACKAGING STRUCTURE

(71) Applicant: Powertech Technology Inc., Hsinchu County (TW)

(72) Inventors: Hung-Hsin Hsu, Hsinchu County (TW); Shang-Yu Chang Chien, Hsinchu County (TW); Nan-Chun Lin, Hsinchu County (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 15/705,250

(22) Filed: Sep. 14, 2017

(65) Prior Publication Data

US 2019/0080971 A1 Mar. 14, 2019

(51) Int. Cl.
| | |
|---|---|
| *H01L 21/26* | (2006.01) |
| *G01R 31/02* | (2006.01) |
| *G01R 31/28* | (2006.01) |
| *H01L 23/00* | (2006.01) |
| *H01L 21/66* | (2006.01) |

(52) U.S. Cl.
CPC .......... *H01L 22/32* (2013.01); *G01R 31/025* (2013.01); *G01R 31/2884* (2013.01); *G01R 31/2896* (2013.01); *H01L 22/14* (2013.01); *H01L 22/34* (2013.01); *H01L 24/02* (2013.01); *H01L 2224/02331* (2013.01); *H01L 2224/02375* (2013.01); *H01L 2224/02379* (2013.01); *H01L 2224/02381* (2013.01)

(58) Field of Classification Search
CPC ......... H01L 22/14; H01L 22/32; H01L 22/34; G01R 31/2884; G01R 31/2896
See application file for complete search history.

(56) References Cited

U.S. PATENT DOCUMENTS

| | | | | |
|---|---|---|---|---|
| 6,899,543 | B2 * | 5/2005 | Goller | H01L 22/34 257/752 |
| 9,417,285 | B2 | 8/2016 | Wang et al. | |
| 2003/0222260 | A1 * | 12/2003 | Tone | H01L 22/34 257/48 |
| 2010/0213963 | A1 * | 8/2010 | Yoshikawa | G01R 31/2896 324/756.03 |
| 2013/0076387 | A1 | 3/2013 | Ishikawa et al. | |
| 2014/0167799 | A1 * | 6/2014 | Wang | H02H 9/046 324/750.14 |

FOREIGN PATENT DOCUMENTS

| | | |
|---|---|---|
| CN | 105593981 | 5/2016 |
| TW | 591730 | 6/2004 |
| TW | I444637 | 7/2014 |

* cited by examiner

*Primary Examiner* — Peniel M Gumedzoe
(74) *Attorney, Agent, or Firm* — JCIPRNET

(57) ABSTRACT

A testing method of a packaging process includes following steps. A substrate is provided. A circuit structure is formed on the substrate. The circuit structure includes a real unit area and a dummy side rail surrounding the real unit area, and a plurality of first circuit patterns is disposed on the real unit area. A second circuit pattern is formed on the dummy side rail, and the second circuit pattern emulates the configurations of at least a portion of the first circuit patterns for operating a simulation test. In addition, a packaging structure adapted for a testing process is also mentioned.

10 Claims, 9 Drawing Sheets

TESTING METHOD OF PACKAGING PROCESS AND PACKAGING STRUCTURE

BACKGROUND OF THE INVENTION

1. Field of the Invention

The present invention generally relates to a testing method, in particular, to a test method of a packaging process.

2. Description of Related Art

With advancement of the technology, the electronic product has been designed to achieve being light, slim, short, and small, so as to develop products that are smaller in volume, lighter in weight, higher in integration, and more competitive in the market. As the products gradually shrinkage in volume, the risk of malfunction or failure of the electronic circuits inside the products is increased accordingly. As such, how to operate an in-line testing during the fabrication process, so as to check the capability and functionality of the circuit components and to lower the risk of failure of the final products, has become a challenge to those researchers in the field.

SUMMARY OF THE INVENTION

The disclosure provides a testing method of a packaging process and a packaging structure, which are adapted to monitor the packaging process in an in-situ manner and to perform an in-line open-short test during the packaging process.

The disclosure provides a testing method of a packaging process. The testing method includes following steps. A substrate is provided. A circuit structure is formed on the substrate. The circuit structure includes a real unit area and a dummy side rail surrounding the real unit area, and a plurality of first circuit patterns is disposed on the real unit area. A second circuit pattern is formed on the dummy side rail, and the second circuit pattern emulates at least a portion of the configurations of the first circuit patterns for operating a simulation test.

The disclosure provides a testing method of a packaging process. The testing method includes following steps. A substrate is provided with a die embedded therein. A first redistribution layer is formed on the substrate. The first redistribution layer includes a plurality of first signal pads having an extension portions respectively. The first signal pads are respectively coupled to the die through a plurality of first vias disposed underneath the first signal pads. An open/short test is operated through the first signal pads.

The disclosure provides a packaging structure which is adapted to a testing process. The packaging structure includes a substrate, a die and a redistribution layer. The die is embedded in the substrate. The redistribution layer is disposed on the substrate. The redistribution layer includes a plurality of signal pads coupled to the die. The signal pads respectively have extension portions for a probing test process.

Based on the above, a testing method of the packaging process may include forming second circuit patterns on the dummy side rail of the circuit structure formed on the substrate. The second circuit patterns emulate the configurations of the first circuit patterns, such that a simulation test such as an open/short test can be performed on the second circuit patterns. The results of the aforementioned simulation test can reflect the conditions of the first circuit patterns. As such, an in-line condition of the packaging process of the real unit area can be monitored through the testing process of the second circuit pattern. Moreover, the condition of the circuit structure disposed on a substrate with a die embedded therein, such as an electrical connection, can be tested through the signal pads of each redistribution layers, which are electrically coupled to the die. The signal pads respectively have extension portions for performing probing tests. As such, the condition of each of the redistribution layers and the stability of the via opening process can be controlled and an in-line test can be performed to each of the redistribution layers during the packaging process. Therefore, the failed redistribution layers can be repaired in a timely manner without affecting the quality of the final products.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
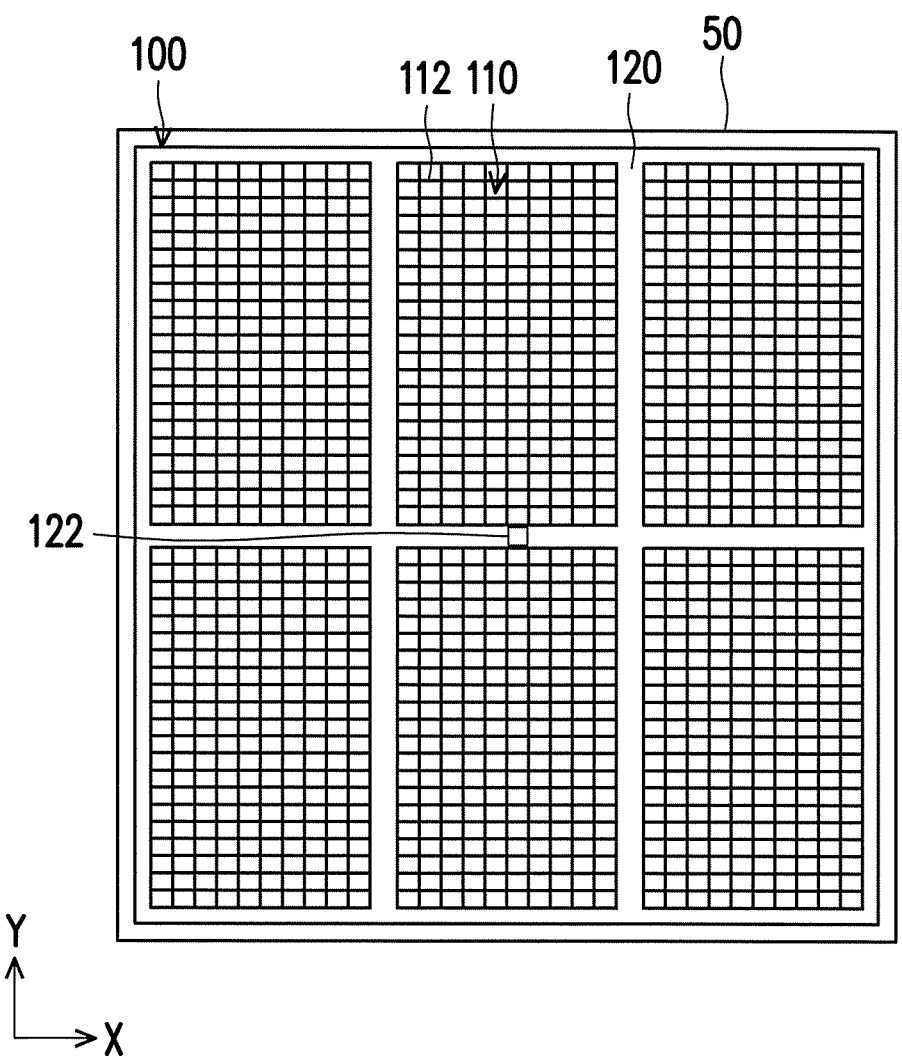
FIG. 1 is schematic top view illustrating a circuit structure of a testing method according to an embodiment of the disclosure.

Reference will now be made in detail to the present preferred embodiments of the invention, examples of which are illustrated in the accompanying drawings. Wherever possible, the same reference numbers are used in the drawings and the description to refer to the same or like parts.

Figure 2:
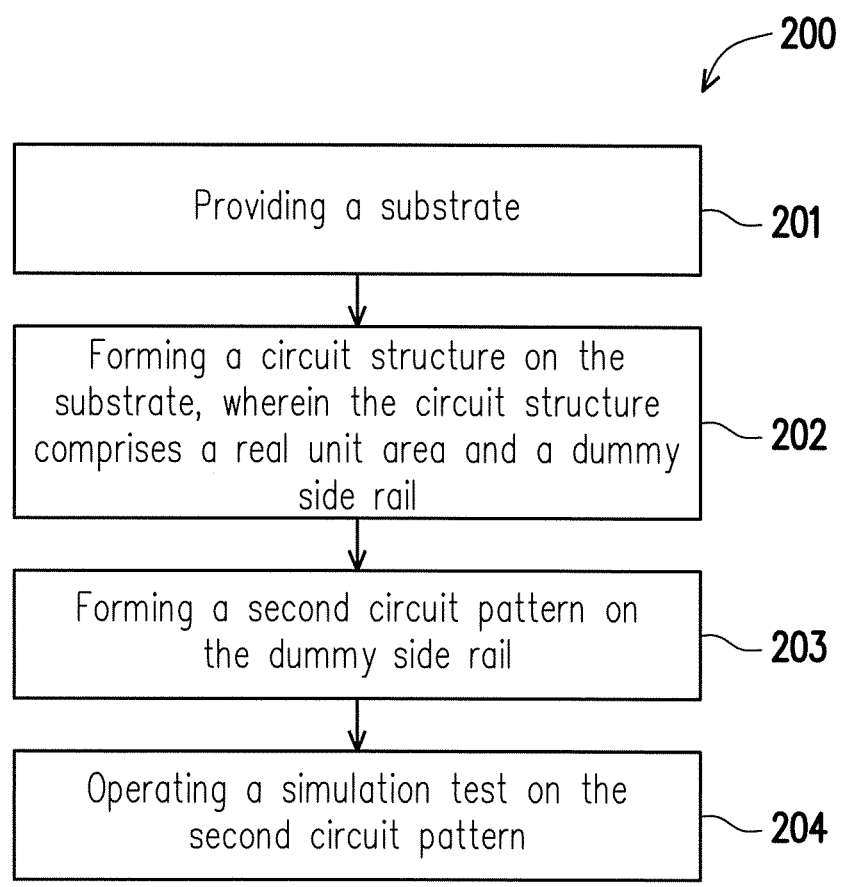
FIG. 2 is a flow chart illustrating a testing method of packaging process according to an embodiment of the disclosure.

FIG. 1 is schematic top view illustrating a circuit structure of a testing method according to an embodiment of the disclosure. FIG. 2 is a flow chart illustrating a testing method of a packaging process according to an embodiment of the disclosure. With reference to FIG. 1 and FIG. 2, the testing method 200 of a packaging process includes providing a substrate 50 (step 201). Then, forming a circuit structure 100 on the substrate 50 (step 202). The circuit structure 100 includes a real unit area 110 and a dummy side rail 120. The dummy side rail 120 surrounds the real unit area 110. The real unit area 110 has a plurality of first circuit patterns 112 disposed thereon along X-Y axis directions. In addition, a second circuit pattern 122 is formed on the dummy side rail 120 (step 203).

In the embodiment, the second circuit pattern 122 emulates the configurations of at least a portion of the first circuit patterns 112 for operating an electrical simulation test (step 204). The first circuit pattern 112 is formed on the real unit area for different electrical connections, functions, and applications. The second circuit pattern 122 disposed at the dummy side rail 120 may be emulated or copied from some critical portions of the first circuit pattern 112. The second circuit pattern 122 is utilized as a testing pattern for operating the electrical simulation test, such as an open/short test or a capability test. The simulation test results of the second circuit pattern 122 may reflect the capability and the stability of the first circuit pattern 112 in a smaller scale. Consequentially, after forming the first circuit pattern 122 on the substrate 50, an in-line test, such as the open/short test, can be performed correspondingly through the second circuit pattern 122 formed on the dummy side rail 120. As such, the real-time capability and stability of the first circuit patterns 112 in the real unit area 110 can be known in the packaging process. Therefore, the stability of forming and packaging process of the first circuit patterns 112 can be controlled to achieve high confidence for the real unit yield.

In the present embodiment, shapes, dimensions, locations, and arrangement densities of the second circuit pattern 122 are designed arbitrarily based on actual demands of the testing process. Moreover, the configurations of the dummy side rail 120 can be defined arbitrarily depending on the manufacturing cost and the benefits of the overall packaging process. Furthermore, a damage or a probing mark possibly generated in the first circuit pattern 112 during the testing process thereof can be prevented through the testing process applied in the second circuit pattern 122.

Figure 3A:
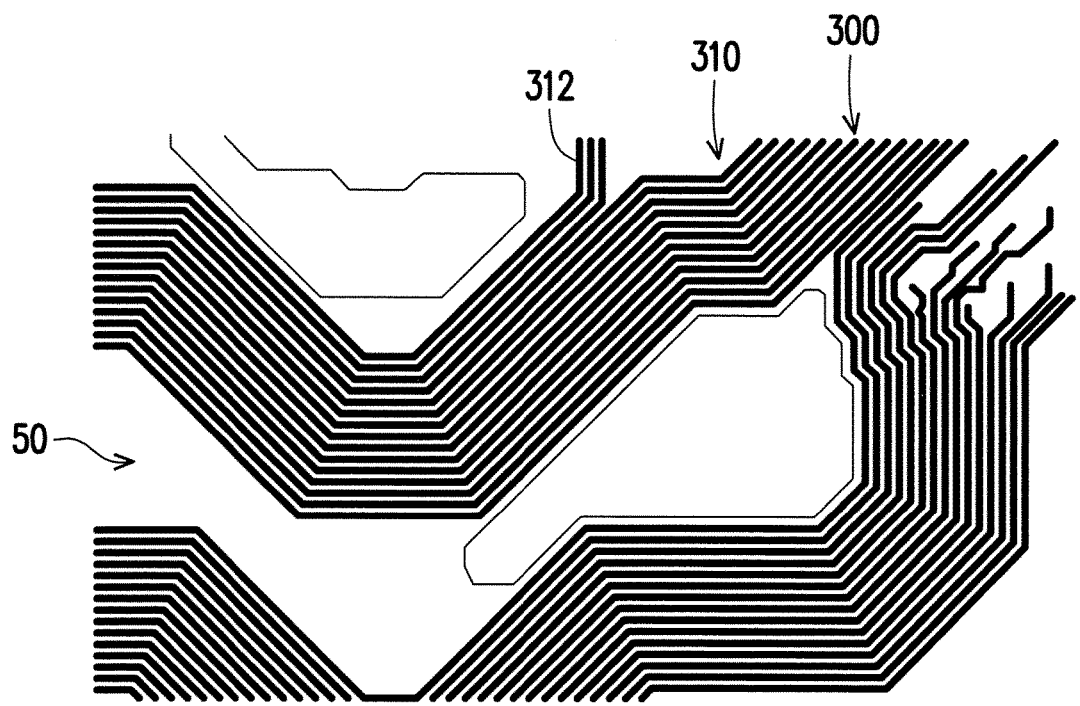
FIG. 3A is a schematic top view illustrating a circuit structure of a testing method according to an embodiment of the disclosure.
Figure 3B:
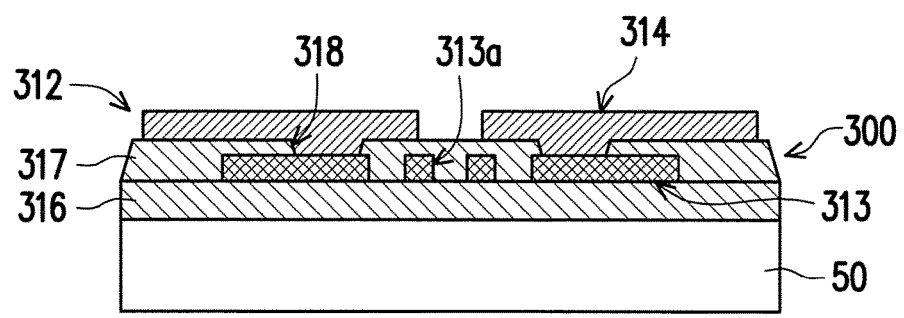
FIG. 3B is a schematic cross-sectional view illustrating the circuit structure of FIG. 3A.

FIG. 3A is a schematic top view illustrating a circuit structure of a testing method according to an embodiment of the disclosure. FIG. 3B is a schematic cross-sectional view illustrating the circuit structure of FIG. 3A. With reference to FIG. 3A and FIG. 3B, the circuit structure 300 formed on the substrate 50 may including a circuit element 310 configured to perform an open/short test in order to have a high confidence for the real unit yield. For example, the circuit element 310 may include a circuit pattern copy 312 formed on the substrate 50. In some embodiments, the circuit pattern copy 312 may be a copy having some critical portions (e.g. minimum line/space area) of the first circuit pattern 112 in the real unit area 110 shown in FIG. 1 by copying from the real unit area 110 to the dummy side rail 120. In some other embodiments, the circuit pattern copy 312 may include different circuit configurations, such as different line pitches, line widths, or number of turns. As shown in FIG. 3B, for example, the circuit pattern copy 312 may include a first redistribution layer 313 disposed on a first dielectric layer 316, and the first redistribution layer 313 includes a fine-line structure 313a. In addition, the circuit pattern copy 312 may include a second redistribution layer 314 disposed on vias 318 of a second dielectric layer 317. The first redistribution layer 313 and the second redistribution layer 314 are electrically connected through the vias 318. The configuration of the circuit pattern copy 312 may depend on the design requirement of the real unit area and it construes no limitation in the disclosure.

Figure 4A:
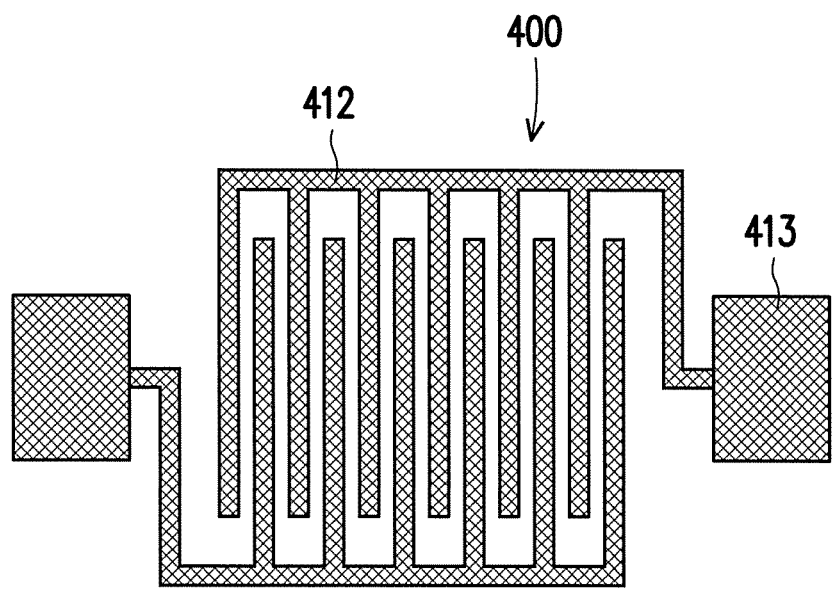
FIG. 4A is a schematic top view illustrating a portion of a second circuit pattern of a circuit structure according to an embodiment of the disclosure.
Figure 4B:
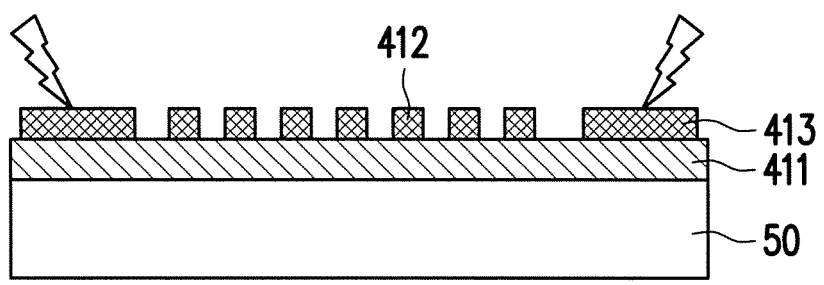
FIG. 4B is a schematic cross-sectional view illustrating the second circuit pattern of FIG. 4A.

FIG. 4A is a schematic top view illustrating a portion of a second circuit pattern of a circuit structure according to an embodiment of the disclosure. FIG. 4B is a schematic cross-sectional view illustrating the second circuit pattern of FIG. 4A. With reference to FIG. 4A and FIG. 4B, a second circuit pattern 400 is disposed on the dummy side rail 120 shown in FIG. 1. The second circuit pattern 400 includes a comb-shaped electrode pattern 412 formed on the first dielectric layer 411. In the embodiment, a line pitch of the comb-shaped electrode pattern 412 may be similar a line pitch of the fine-line structures 313a in FIG. 3B. For example, the line pitch of the comb-shaped electrode pattern 412 may be equal to or less than the line pitch of the fine-line structure 313a of the first redistribution layer 313. A line-and-space ratio of the comb-shaped electrode pattern 412 may be further minimized for the purposes of defining a limitation of the pitch resolution of the fine-line structure 313a, performing an electrical short check, and monitoring a stability of the overall packaging process. The above-mentioned comb-shaped electrode pattern 412 may further include a plurality of testing pads 413 formed on the first dielectric layer 411. For example, one of the testing pads 413 may be electrically connected to one end of the comb-shaped electrode pattern 412 in the top view as shown in FIG. 4A. The testing pads 413 may be probing areas for a probing card to perform an electrical open/short test. As illustrated in FIG. 4B, the lightning shaped indicator indicates the above-mentioned probing positions.

Figure 5A:
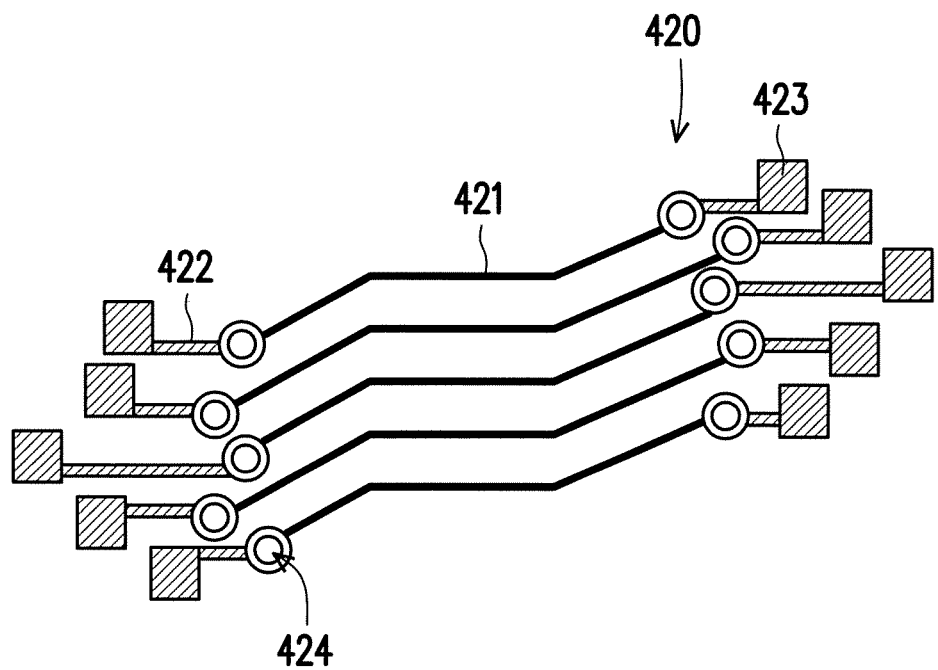
FIG. 5A is a schematic top view illustrating a portion of a second circuit pattern of a circuit structure according to an embodiment of the disclosure.
Figure 5B:
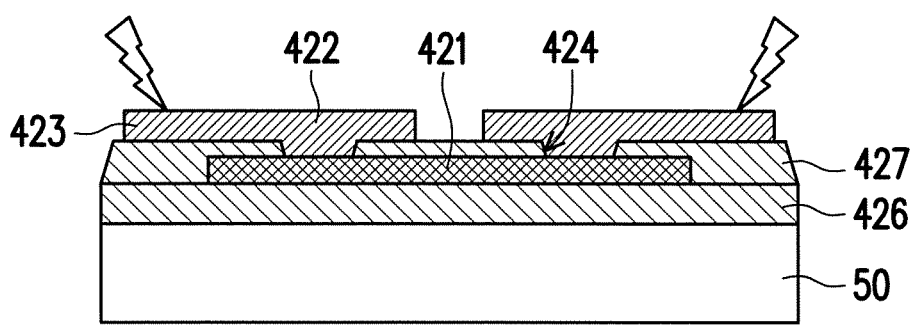
FIG. 5B is a schematic cross-sectional view illustrating the second circuit pattern of FIG. 5A.

FIG. 5A is a schematic top view illustrating a portion of a second circuit pattern of a circuit structure according to an embodiment of the disclosure. FIG. 5B is a schematic cross-sectional view illustrating the second circuit pattern of FIG. 5A. With reference to FIG. 5A and FIG. 5B, the second circuit pattern may include a redistribution layer chain pattern 420. The redistribution layer chain pattern 420 may include a first redistribution layer 421, a plurality of vias 424 coupled to the first redistribution layer 421, and a second redistribution layer 422 electrically connected to the vias 424 and the first redistribution layer 421. For example, a first dielectric layer 426 may be formed on the substrate 50. The first redistribution layer 421 may then be formed on the first dielectric layer 426. Next, a second dielectric layer 427 having a plurality of openings may be formed on the first dielectric layer 426 to cover the first redistribution layer 421. The openings of the second dielectric layer 427 may expose at least a portion of the first redistribution layer 421. Subsequently, the vias 424 may be formed in the openings of the second dielectric layer 427 and electrically connected to the first redistribution layer 421. The second redistribution layer 422 may be formed on the vias 424 and the second dielectric layer 427. In other words, the first redistribution layer 421 and the second redistribution layer 422 may be electrically connected through the vias 424. In the present embodiment, the configurations of the first redistribution layer 421 and the second redistribution layer 422 may be similar with the configurations of at least a portion of the first redistribution layer 313 and the second redistribution layer 314.

Moreover, since the vias 424 are electrically connected to the first redistribution layer 421 and the second redistribution layer 422, a stability check of the filling process of the dielectric opening to form the vias 424 can be performed. In some embodiments, the redistribution layer chain pattern 420 may further include a plurality of probing pads 423 formed on the second dielectric layer 427 and electrically connected to the second redistribution layer 422. For example, one of the probing pads 423 may be electrically connected to one end of the second redistribution layer 422 in the top view as shown in FIG. 5A for applying the probing test. Moreover, the lightning shaped indicator in FIG. 5B indicates the probing positions of the probes.

Figure 6A:
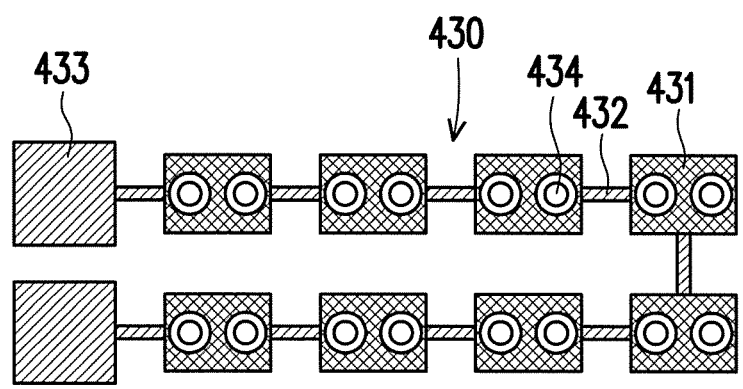
FIG. 6A is a schematic top view illustrating a portion of a second circuit pattern of a circuit structure according to an embodiment of the disclosure.
Figure 6B:
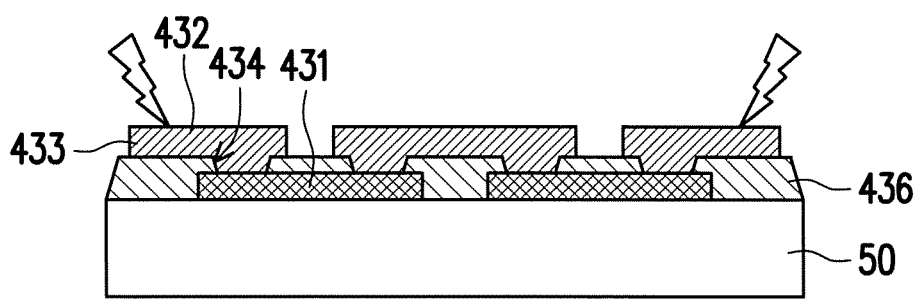
FIG. 6B is a schematic cross-sectional view illustrating the second circuit pattern of FIG. 6A.

FIG. 6A is a schematic top view illustrating a portion of a second circuit pattern of a circuit structure according to an embodiment of the disclosure. FIG. 6B is a schematic cross-sectional view illustrating the second circuit pattern of FIG. 6A. With reference to FIG. 6A and FIG. 6B, the second circuit pattern may include a via chain pattern 430. The vias 434 formed in the first dielectric layer 436 in FIG. 6B may be electrically connected to each other through the first redistribution layer 431 disposed underneath the vias 434 to form the via chain pattern 430. In addition, the second redistribution layer 432 is disposed above the vias 434 and electrically connected to the first redistribution layer 431 through the vias 434.

In the present embodiment, the openings of the vias 434 formed in the first dielectric layer 436 is adapted to be minimized for a capability check and a stability check of a via opening process in the circuit pattern copy 312. Moreover, a plurality of testing pads 433 may be formed at different ends of the via chain pattern 430 for applying the probing test. As shown in FIG. 6B, the lightning shaped indicators indicate the probing areas.

Figure 7A:
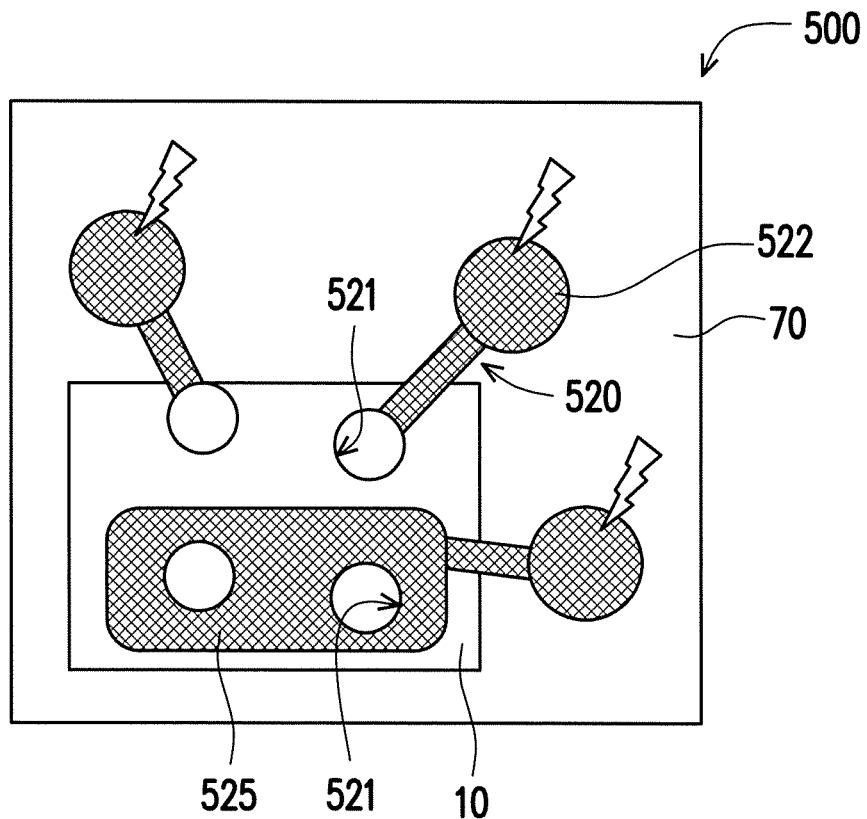
FIG. 7A is a schematic top view illustrating a circuit structure of a testing method according to another embodiment of the disclosure.
Figure 7B:
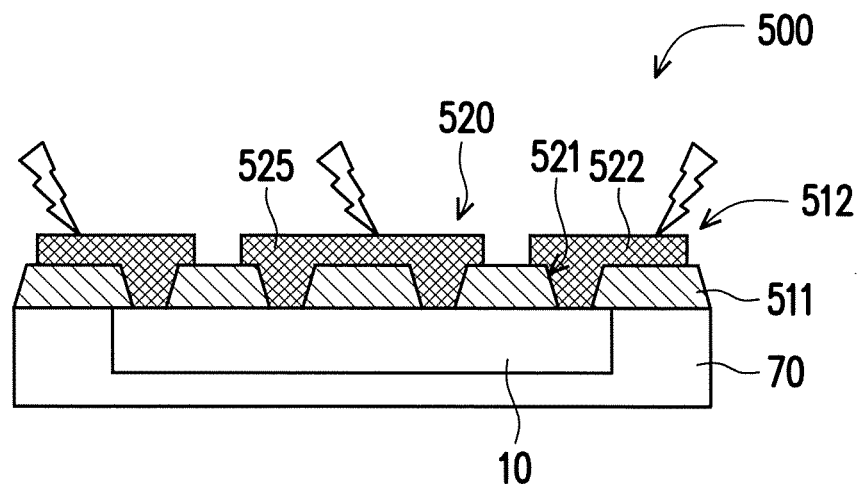
FIG. 7B is a schematic cross-sectional view illustrating the second circuit pattern of FIG. 7A.
Figure 7C:
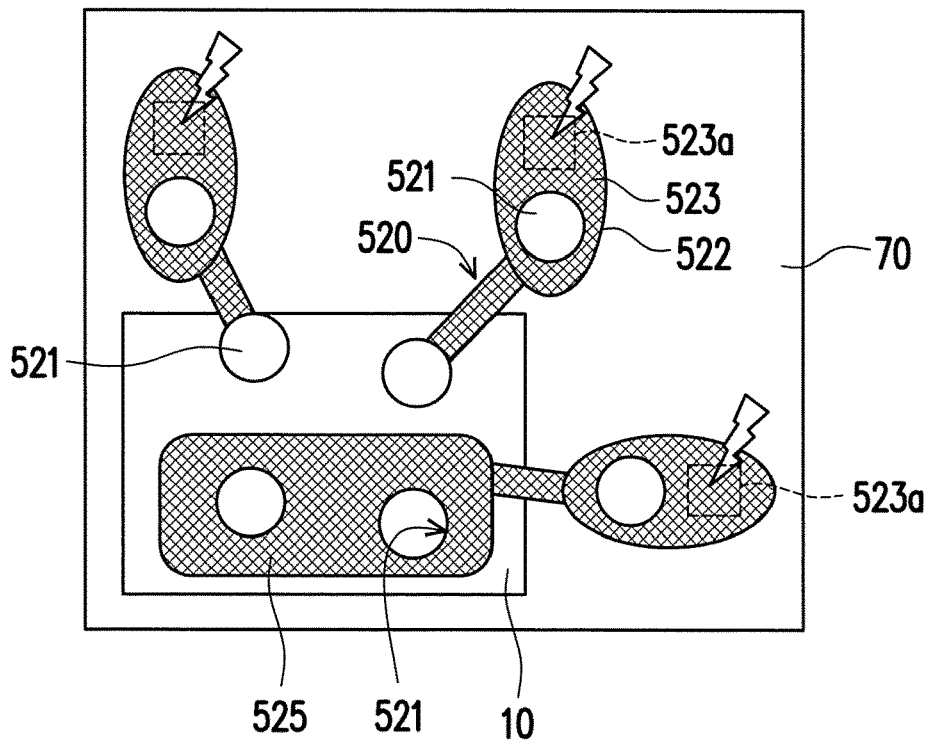
FIG. 7C is a schematic top view of the signal pads of the circuit structure in FIG. 7A.
Figure 8:
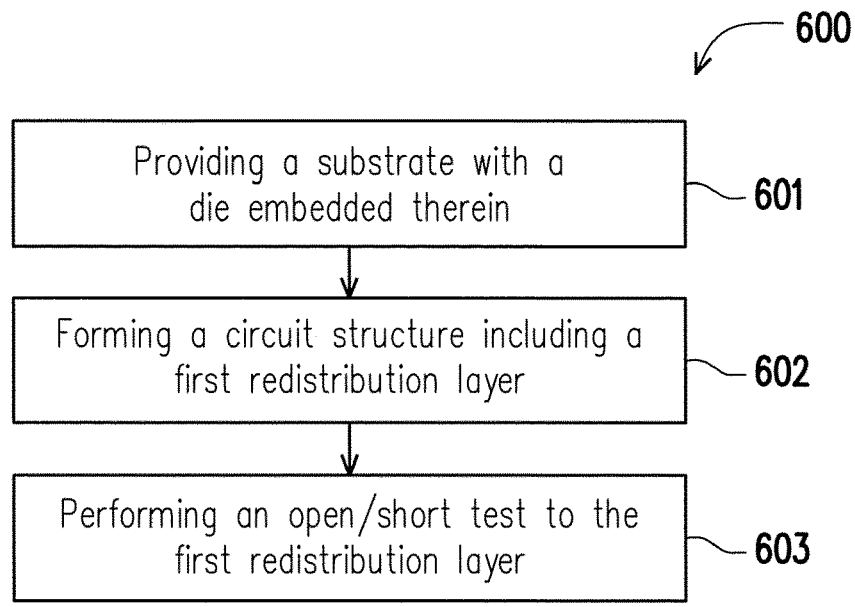
FIG. 8 is a flow chart illustrating the testing method of packaging process in FIG. 7A.

FIG. 7A is a schematic top view illustrating a circuit structure of a testing method according to another embodiment of the disclosure. FIG. 7B is a schematic cross-sectional view illustrating the second circuit pattern of FIG. 7A. FIG. 7C is a schematic top view of signal pads of the circuit structure in FIG. 7A. FIG. 8 is a flow chart illustrating the testing method of the circuit pattern in FIG. 7A. With reference to FIG. 7A, FIG. 7B, and FIG. 8, the testing method 600 includes providing a substrate 70 with a die 10 embedded therein (step 601). A circuit structure 500 including a first redistribution layer 520 having a plurality of first signal pads 522 are formed (step 602). The first signal pads 522 are coupled to the die 10 respectively through the first vias 521 disposed underneath the first signal pads 522. Next, an open/short test can be performed to the first redistribution layer 520 through probing the first signal pads 520 using a probe card of the test machine (step 603).

In addition, as illustrated in FIG. 7C, the surface area of the first signal pads 522 may be further enlarged to include extension portions 523 which has probing areas 523a for applying probing tests. As shown in FIG. 7C, a probe card may be used to probe the positions on first signal pads 522 where the lightning shaped indicators indicate. Specifically, as the surface area of the first signal pads 520 is enlarged, the probing areas 523a can be separated from the first vias 521.

A scratch or a damage which may be caused by the probing tests on the surface of the first vias 521 or other vias of the rest redistribution layers can be prevented.

As shown in FIG. 7B, the first redistribution layer 520 may further include first ground/power pads 525 disposed on the die 10, the first vias 521 and the dielectric layer 511. Moreover, an open/short test may be performed through the ground/power pads 525, and the probing positions are where the lightning shaped indicators indicate.

Figure 9A:
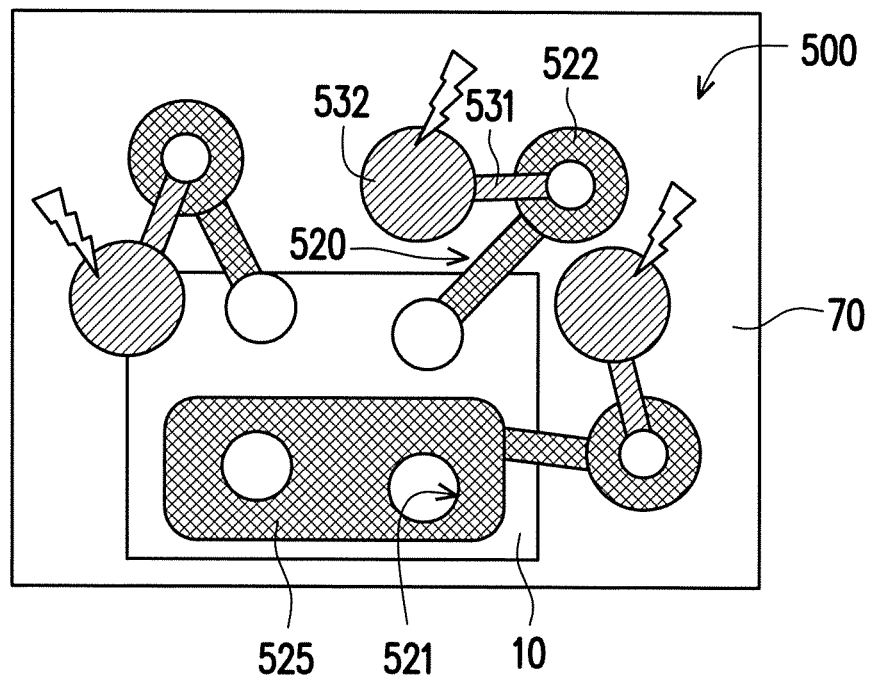
FIG. 9A is a schematic top view illustrating a circuit structure of a testing method according to another embodiment of the disclosure.
Figure 9B:
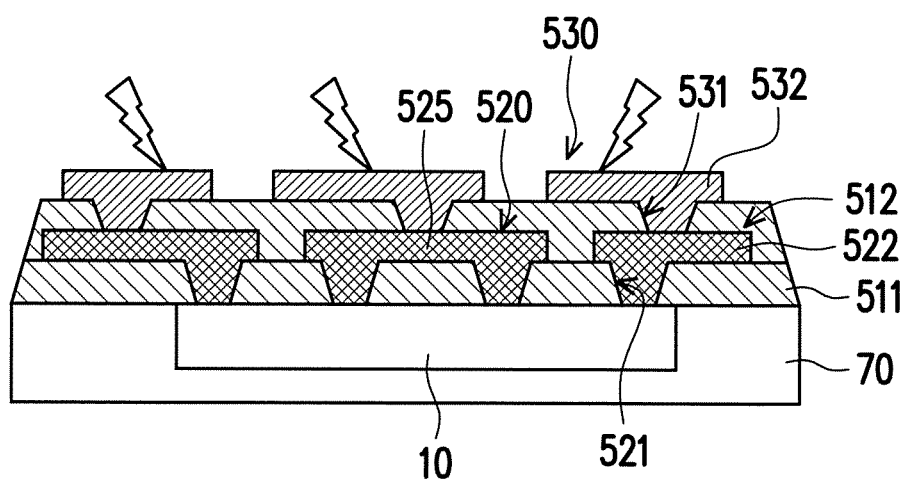
FIG. 9B is a schematic cross-sectional view illustrating the second circuit pattern of FIG. 9A.

FIG. 9A is a schematic top view illustrating a circuit structure of a testing method according to another embodiment of the disclosure. FIG. 9B is a schematic cross-sectional view illustrating the second circuit pattern of FIG. 9A. With reference to FIG. 9A and FIG. 9B, the circuit structure 500 may further include a second redistribution layer 530 disposed on the first redistribution layer 520. The second redistribution layer 530 may include a plurality of second signal pads 532. The second signal pads 532 are electrically connected to the first redistribution layer 520 through second vias 531 disposed underneath the second signal pads 532. In the embodiment, an open/short test to the second redistribution layer 530 can be performed through the second signal pads 532. In addition, the second redistribution layer 530 may also further include second ground/power pads disposed above the second dielectric layer 512 and the second vias 531 for an open/short test.

In the present embodiment, the open/short tests can be individually applied to each redistribution layer to ensure the connection and functionalities of each redistribution layer. As such, after forming the first redistribution layer 520 and before starting the process of forming the second redistribution layer 530, an in-line test to the first redistribution layer 520 can be performed firstly to ensure the electrical connection of the first redistribution layer 520. A repair process may be applied to a portion of the first redistribution layer 520 by a repair machine (not shown) through a cut or a re-connect process when the first redistribution layer 520 fails the tests. Therefore, the quality of the final products can be ensured through above-mentioned in-line test performed during the packaging process of the die 10. As such, the risk of failure and the yield loss of the final products can be further reduced.

Based on the foregoing, the above-mentioned testing method of the packaging process can be applied by forming second circuit patterns in the dummy side rail surrounding the real unit areas. The second circuit patterns may emulate or copy the critical patterns of the first circuit patterns in the real unit areas. The second circuit patterns can be performed with the electrical simulation tests, such as the open/short test, the stability check and the capability check, so as to check the electrical connection of the redistribution layers, the stability and the capability of the via opening process. Due to the similarity of the configurations of the second circuit patterns and the first circuit patterns, the results of simulation test of the second circuit pattern can reflect the real-time conditions of the first circuit patterns. In addition, the limitation such as the fine-line pitches of the first circuit patterns can be further defined through the test results of the second circuit patterns. Accordingly, the forming process of the redistribution layer n the real unit area can be monitored through the second circuit patterns in the dummy side rail, and thereby the confidence for real unit yield can be further enhanced.

In addition, the testing method of the packaging process can also be performed by probing the signal pads. The signal pads of each redistribution layer formed on the substrate are respectively coupled to the die. Accordingly, an in-line test, such as an open-short test, can be applied to each of the redistribution layers and the connecting vias. Therefore, the electrical connection of the redistribution layers and the connecting vias can be ensured to prevent the short circuit or the broken circuit. Moreover, a repairing process can be applied to the failed redistributions layer by a repair machine based on the results of the testing processes. For example, the bridge failure can be repaired by a cut process, and the broken circuit can be repaired by a re-connect process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A testing method of a packaging process comprising:
   providing a substrate;
   forming a circuit structure on the substrate, wherein the circuit structure comprises a real unit area and a dummy side rail surrounding the real unit area, and a plurality of first circuit patterns is disposed on the real unit area; and
   forming a second circuit pattern on the dummy side rail, wherein the second circuit pattern emulates configurations of at least a portion of the first circuit patterns for operating a simulation test and is electrically isolated from the first circuit patterns.

2. The testing method according to claim 1, wherein the second circuit pattern comprises a comb-shaped electrode pattern, wherein the comb-shaped electrode pattern comprises a plurality of probing pads.

3. The testing method according to claim 2, further comprising minimizing a line-and-space ratio of the comb-shaped electrode pattern for operating the simulation test.

4. The testing method according to claim 1, wherein the second circuit pattern comprises a via chain pattern formed on the dummy side rail, and the via chain pattern comprises a plurality of vias.

5. The testing method according to claim 4, further comprising minimizing respective openings of the vias and performing a capability check and a stability check to the openings of the vias.

6. The testing method according to claim 1, wherein the second circuit pattern comprises a plurality of redistribution layers and a plurality of vias electrically connected through the redistribution layers to form a redistribution layer chain pattern.

7. The testing method according to claim 6, further comprising performing an electrical connection check toward the redistribution layer chain pattern.

8. The testing method according to claim 1, wherein the simulation test comprises an open/short test.

9. The testing method according to claim 1, wherein the simulation test is performed through a probe card of a test machine.

10. The testing method according to claim 1, wherein the packaging process comprises a fan-out packaging process.

* * * * *